(12) United States Patent
Gardner et al.

(10) Patent No.: US 7,688,596 B1
(45) Date of Patent: Mar. 30, 2010

(54) ELECTROCHEMICAL CELL SUPPORTING A PROTECTIVE HOUSING FOR ELECTRICAL COMPONENTS

(75) Inventors: William Gardner, East Freetown, MA (US); Glen Dupliesea, Dayville, CT (US); John Hession, Braintree, MA (US); Douglas Woodnorth, Needham, MA (US); Walter Carlson, East Taunton, MA (US); Kevin Li, Stow, MA (US)

(73) Assignee: Electrochem Solutions, Inc., Clarence, NY (US)

( * ) Notice: Subject to any disclaimer, the term of this patent is extended or adjusted under 35 U.S.C. 154(b) by 599 days.

(21) Appl. No.: 11/737,445

(22) Filed: Apr. 19, 2007

(51) Int. Cl.
H05K 5/03 (2006.01)
H01G 5/014 (2006.01)

(52) U.S. Cl. .................. 361/752; 361/730; 361/517; 361/519; 361/535; 361/537; 29/830; 429/163; 429/175; 429/179; 174/520

(58) Field of Classification Search .............. 361/517, 361/519, 535, 537, 730, 736, 752; 429/163, 429/164, 170, 175, 176, 179; 174/520; 29/830, 29/837
See application file for complete search history.

(56) References Cited

U.S. PATENT DOCUMENTS

| | | | | |
|---|---|---|---|---|
| 4,302,517 A * | 11/1981 | Dziak | ........................... | 429/66 |
| 4,507,370 A * | 3/1985 | Urry | ........................... | 429/142 |
| 4,624,514 A * | 11/1986 | Smith | ........................... | 379/412 |
| 5,750,283 A * | 5/1998 | DePalma et al. | .............. | 429/56 |
| 5,770,328 A * | 6/1998 | Friedli et al. | .................. | 429/96 |
| 5,786,980 A * | 7/1998 | Evans | ........................... | 361/502 |
| 6,205,034 B1 | 3/2001 | Zayatz | | |
| 6,317,335 B1 | 11/2001 | Zayatz | | |
| 6,426,867 B1 | 7/2002 | Zayatz | | |
| 6,437,239 B1 | 8/2002 | Zayatz | | |
| 6,445,567 B1 * | 9/2002 | Komatsuki et al. | .......... | 361/518 |
| 6,617,953 B2 | 9/2003 | Zayatz et al. | | |
| 6,618,273 B2 | 9/2003 | Zayatz et al. | | |
| 6,671,187 B1 * | 12/2003 | Zayatz | ........................ | 361/824 |
| 6,831,827 B1 | 12/2004 | Zayatz | | |
| 6,991,872 B2 * | 1/2006 | Yoppolo et al. | ............... | 429/56 |

* cited by examiner

Primary Examiner—Dameon E Levi
(74) Attorney, Agent, or Firm—Michael F. Scalise

(57) ABSTRACT

A protective housing for a circuit board mounted on an end of a cell is described. The protective housing includes a cut-out in its sidewall and a retaining wall centered in the cut-out. This provides a pair of gaps, one on each side of the retaining wall between the cut-out. These gaps are size so that lead wires extending from the circuit board are captured therein in a tight-fitting relationship. Consequently, the lengths of the leads extending from the protective housing of the cell to a quick disconnect at the distal end of the leads is precisely controlled. If desired, there can be more than one retaining wall providing a plurality of gaps for capturing a plurality of lead wires therein.

26 Claims, 8 Drawing Sheets

ELECTROCHEMICAL CELL SUPPORTING A PROTECTIVE HOUSING FOR ELECTRICAL COMPONENTS

BACKGROUND OF THE INVENTION

1. Field of the Invention

This invention relates generally to housings for protecting an electrical component, and more particularly to a protection housing for a circuit board connected to an electrochemical cell or battery. The protection housing comprises a cut-out in its sidewall and an upwardly extending retaining wall in the cut-out. The retaining wall in conjunction with the cut-out provide at least one gap for securing a lead wire from the electrical component at a precise distance from a quick disconnect provided at the distal lead end.

2. Prior Art

Protective housings are known for protecting an electrical component, such as a fuse and diode assembly, mounted on an electrochemical cell. Examples of protection housings, sometimes referred to as snap-cap devices, for an electrical component connected to an electrochemical cell are described in U.S. Pat. Nos. 6,205,034, 6,317,335 6,426,867, and 6,437, 239, all to Zayatz, and 6,617,953 and 6,618,273, both to Zayatz et al., the disclosures of which are hereby incorporated by reference.

Leads extending from the circuit board are provided with a quick disconnect at their distal end. The quick disconnect is then plugged into the receptacle of a device or instrument powered by the cell. End users require that the length of the leads extending from the cell be of a precise length dictated by a specific application. In conventional protective housings, the length of the leads extending from the cell is difficult to regulate.

SUMMARY OF THE INVENTION

According to the present invention, a protective housing for a circuit board is mounted on an end of a cell. The protective housing includes a cut-out in its sidewall and a retaining wall centered in the cut-out provides a pair of gaps, one on each side of the retaining wall between the cut-out. These gaps are sized to receive any number of lead wires extending from the circuit board so that the leads are captured therein in a tight-fitting relationship. This means that the leads can be moved in and out of the gaps, but only with a moderate amount of force. Consequently, the lengths of the leads extending from the protective housing of the cell to a quick disconnect provided at the distal end of the leads is precisely controlled. Typical applications for the present protective housing include a stick pack of batteries that are electrically connected together. That way, lead wires extending from the electrical components of the batteries are provided at precise distances from a quick disconnect provided at the distal lead ends.

These and other aspects and advantages of the present invention will become increasingly more apparent to those skilled in the art by reference to the following description.

DETAILED DESCRIPTION OF THE PREFERRED EMBODIMENTS

Figure 1:
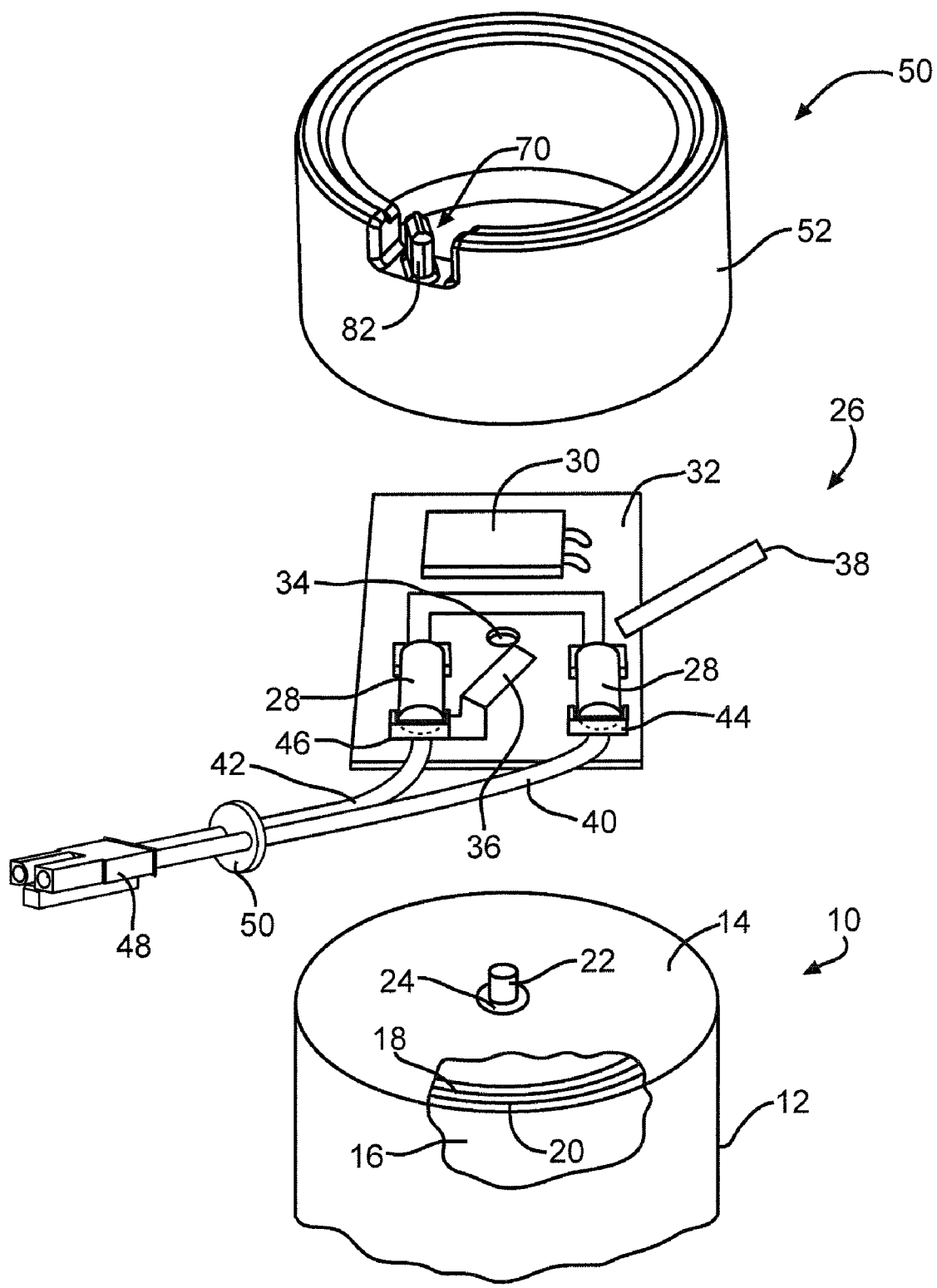
FIG. 1 is an exploded view of a protective housing 50 surrounding a circuit board 26 mounted on the header 14 of an electrochemical cell 10.

Referring now to the drawings, FIG. 1 is an exploded view of an electrochemical cell 10 comprising a casing 12 closed by a lid or header 14 to house the electrochemical components therein. The cell comprises an anode 16 and a cathode 18 segregated from each other by a separator 20 and activated with an electrolyte. The cell is not intended to be limited to any particular chemistry, and can comprise a solid anode/ solid cathode type or a solid anode/liquid depolarizer type. The cell can be of either a primary or a secondary chemistry. Exemplary chemistries include lithium/iodine, lithium/silver vanadium oxide, Li-ion cells, and the like.

In any event, the cell is typically built in a case-negative configuration having the anode electrically connected to the casing 12 and header 14 as the negative terminal and the cathode electrically connected to a terminal pin 22. The terminal pin 22 is electrically isolated from the casing 12 and header 14 by an insulating glass 24 forming a glass-to-metal seal. The cell can also be built in a case-positive configuration having the cathode connected to the casing and header and the anode connected to the terminal pin.

A circuit board 26 having any one of a number of electrical components, such as fuses 28 and diode 30, supported on a substrate 32 of an insulating material is mounted on the cell header 14. The exact electrical components and their configuration are not necessarily part of the present invention and depend on the intended application of the cell 10. A thin NOMEX® disc (not shown) with double sided high temperature adhesive may be used to secure the insulative substrate 32 of the circuit board 26 to the header 14.

The substrate 32 has an aperture 34 sized to receive the terminal pin 22 when the circuit board 26 is mounted on the cell header 14. In this position, the terminal pin 22 is connected to a first lead 36 having one of its ends disposed immediately adjacent to the aperture 34. That way, when the circuit board 26 is supported on the cell header with the terminal pin 22 extending through the aperture 34, a weld (not shown) is used to connect the first lead 36 to the terminal pin. The other end of the lead 36 is connected to an electrical trace (not shown) embedded in or provided on the insulative substrate 32.

A second lead 38 has its proximal end supported on the substrate 32 and connected to an electrical trace (not shown) embedded therein or provided thereon. The distal end of this lead 38 is for connecting to the negative terminal of the case-negative cell 10. With the circuit board 26 mounted on the cell header 14 and cell casing 12, the distal end of the second lead 38 lays on the header 14 and is secured thereto to make electrical contact with the negative cell terminal.

Leads 40 and 42 are electrically connected to respective conductive lands 44, 46 in electrical continuity with the fuses 28 and other components of the circuit board 26. The leads 40, 42 join to a quick disconnect 48 molded onto their distal ends.

The quick disconnect 48 provides for readily connecting and disconnecting the cell 10 via the circuit board 26 and the attached leads 40, 42 to a load (not shown) powered by the cell 10. A grommet 50 is positioned on the leads 40, 42 between the circuit board 26 and the quick disconnect 48.

In order to protect the circuit board 26 from damage, for example, if the cell is used to power a downhole tool in an oil well logging or drilling operation, a protective housing 50 is provided. A material that is suitable for the protective housing 50 is a polyamide sold by E.I. du Pont de Nemours and Company under the trademark ZYTEL® (Nylon 6/6) 70G33L. Other suitable materials include VICTREX® (PEEK) 450-G manufactured by Victrex USA Inc. of Westchester, Pa., a polyamide-imide available from DSM Engineering Plastic Products, Inc. of Reading, Pa., as TOR-LON® 4203 PAI, a material marketed under the name KETRON® PEEK 1000 by DSM Engineering Plastic Products, Inc., and a liquid crystal polymer market as ZENITE® by E.I. du Pont de Nemours and Company.

Figure 2:
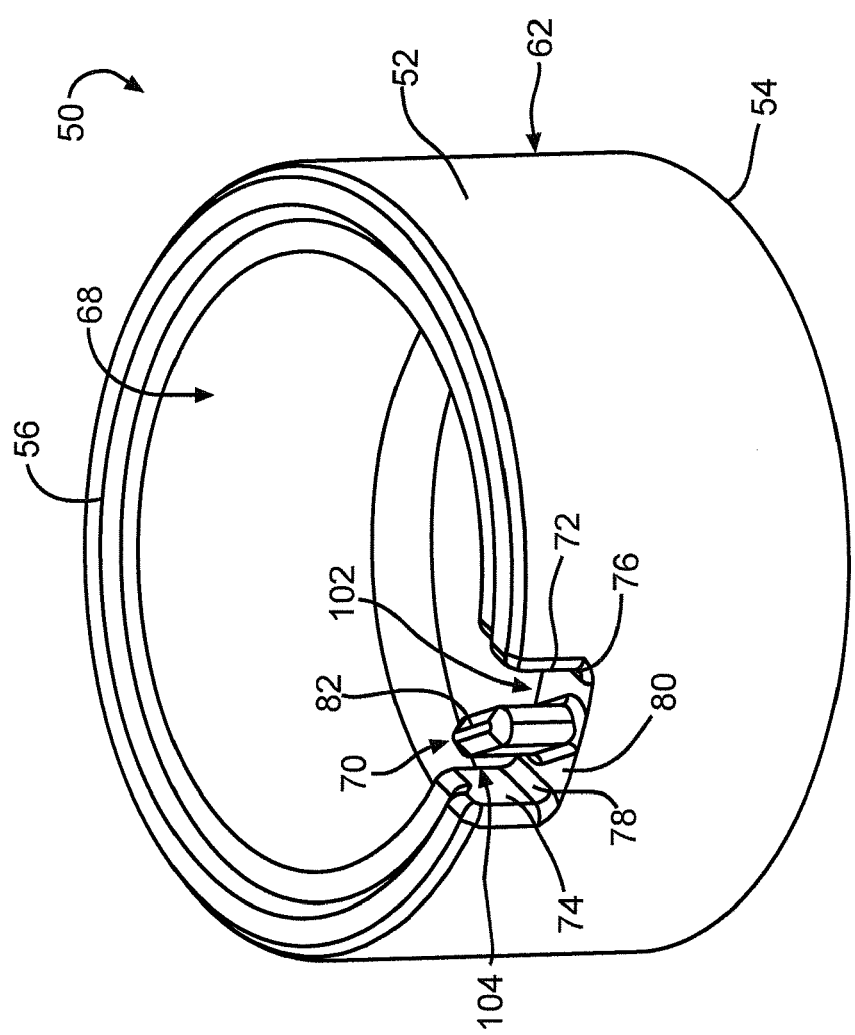
FIG. 2 is a perspective view of the protective housing 50.
Figure 3:
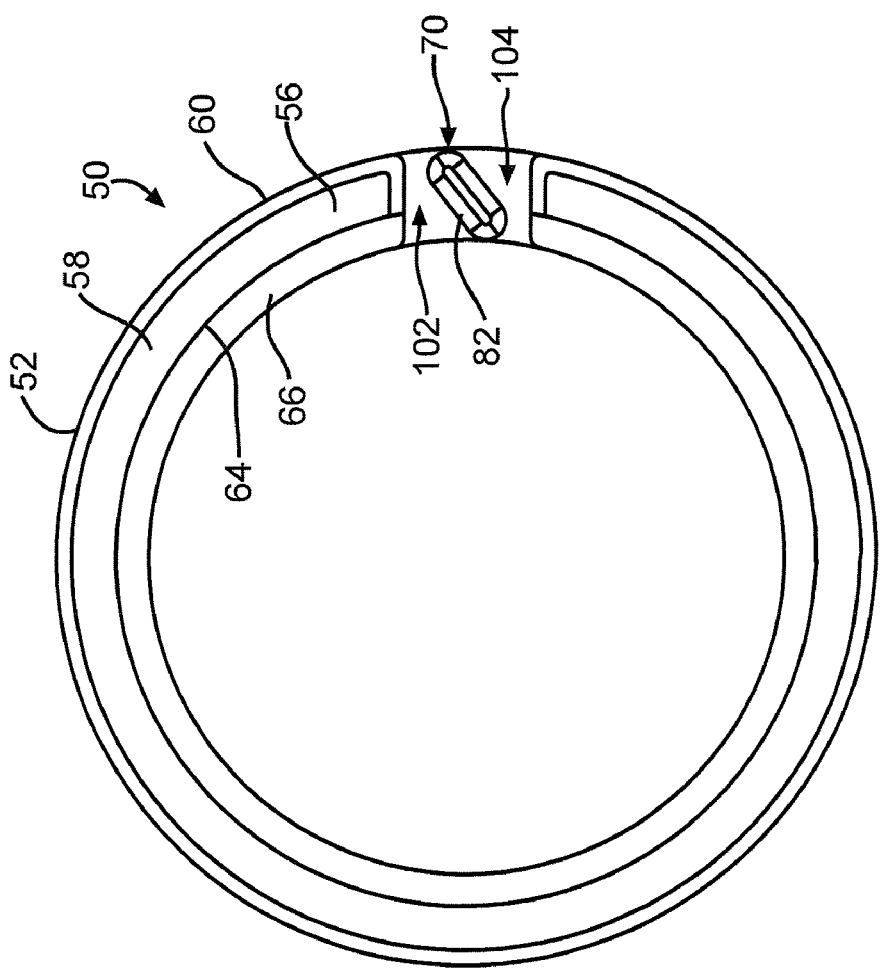
FIG. 3 is a plan view of the protective housing 50.
Figure 4:
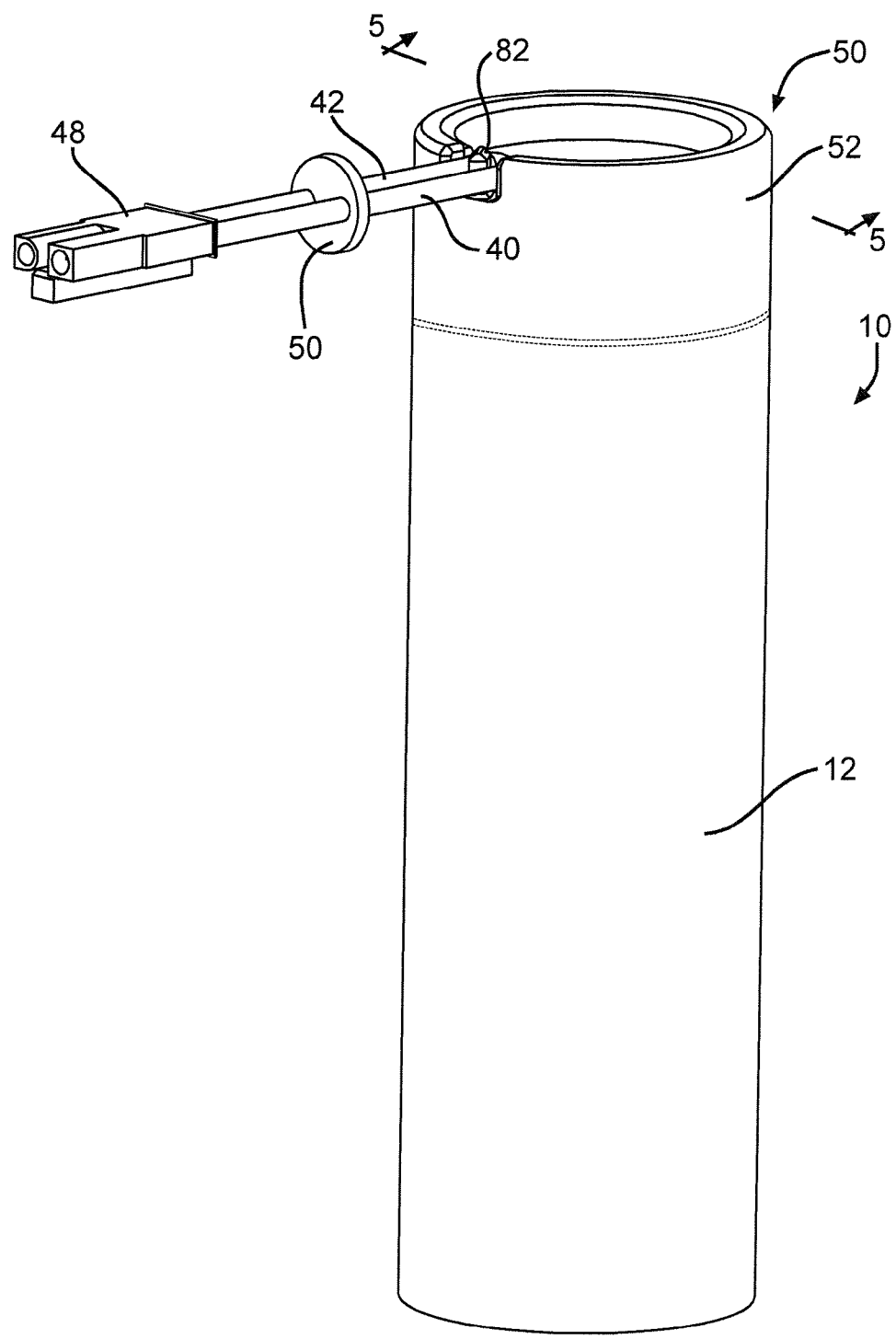
FIG. 4 is a side elevational view of the electrochemical cell 10 shown in FIG. 1 with a leads 40, 42 extending from the circuit board 26 and held in position by a retainer 82 of the protective housing 50.
Figure 5:
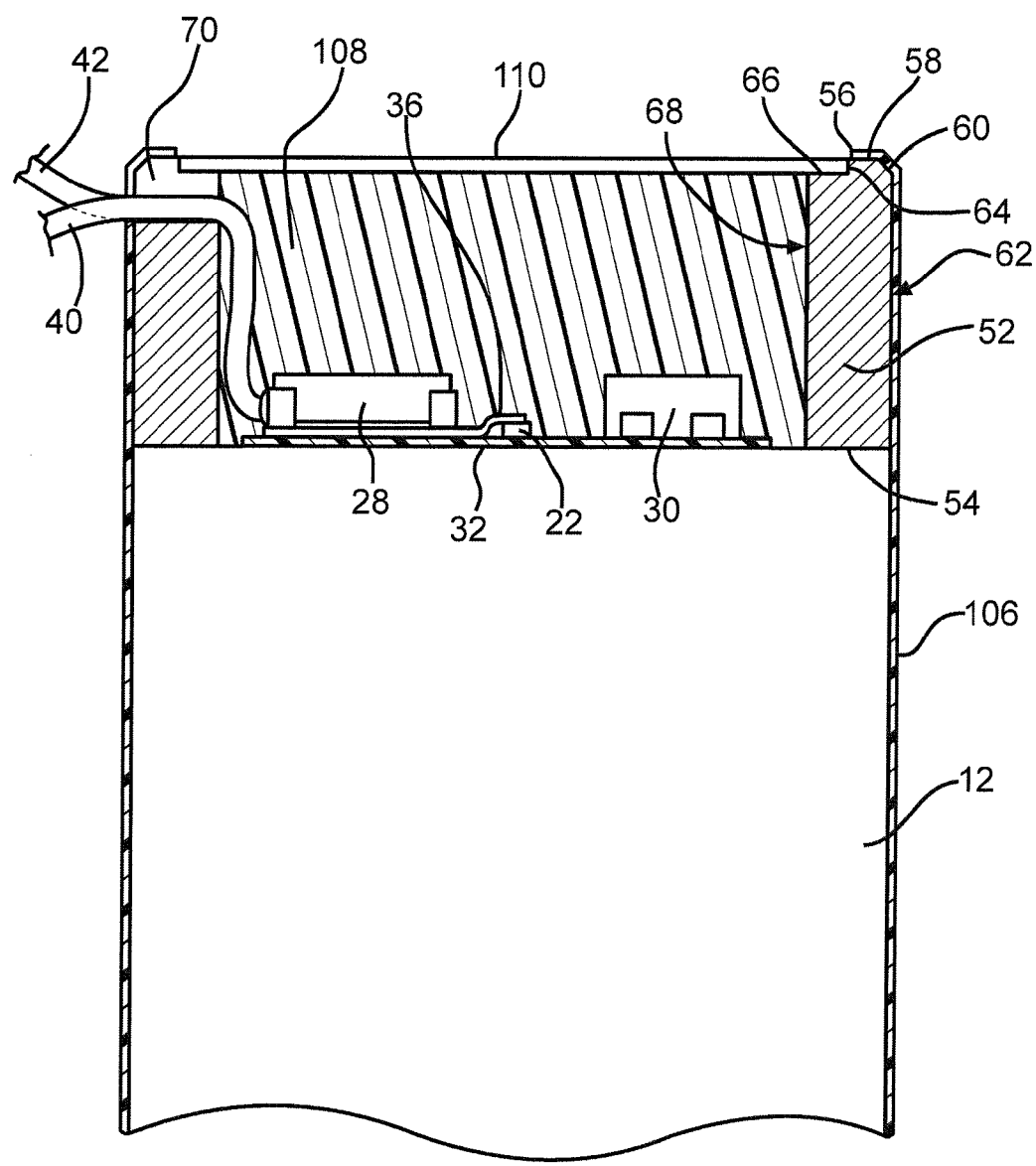
FIG. 5 is a cross-sectional view along line 5-5 of FIG. 4.
Figure 6:
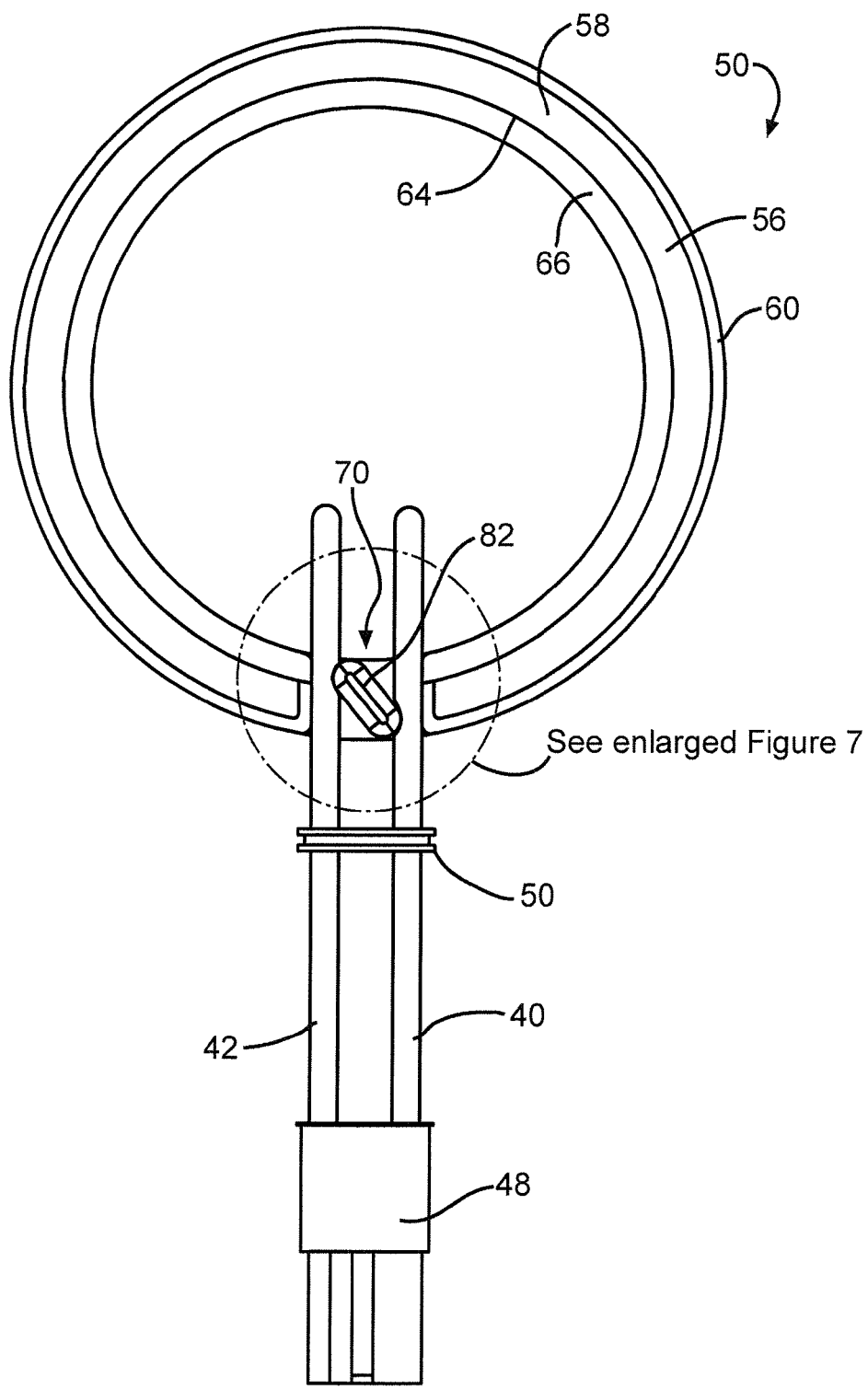
FIG. 6 is a plan view of the leads 40, 42 being held in position by the retainer 82 of the protective housing 50 as shown in FIG. 4.

As particularly shown in FIGS. 2, 3 and 5, the protective housing 50 comprises a surrounding sidewall 52 of a shape that substantially matches that of the cell header 14. Since the exemplary cell is housed in a cylindrical casing 12, the protective housing 50 is circular. However, it is within the scope of the present invention that the protective housing 50 can have other multi-sided shapes, such as square, rectangular, octagonal, and the like. Also, the shape and size of the protective housing sidewall 52 need not necessarily match that of the cell header. For example, the protective housing 50 can be of a standard size that fits inside of a spacer (not shown) that captures and holds the housing to the cell in a similar manner as described in U.S. Pat. No. 6,832,827 to Zayatz et al. This patent is assigned to the assignee of the present invention and incorporated herein by reference.

The surrounding sidewall 52 of the protection housing 50 has a height that extends from a planar lower end 56 to an upper end 56. The upper end 56 comprises an upper annular edge 58 having a planar surface that extends to a beveled edge 60 meeting a cylindrical outer surface 62. A step 64 at the upper annular edge 58 forms an inner annular edge 66 having a planar surface extending to a cylindrical inner surface 68. The outer and inner annular surfaces 62, 68 extend to the planar lower end 54 and the distance between them provided the thickness for the protective housing surrounding sidewall 52.

As particularly shown in the drawings, the protective housing 50 includes a recess cut-out 70 extending completely through the thickness of the protective housing surrounding sidewall 52 from the outer annular surface 62 to the inner annular surface 68 at the upper end 56. The recess cut-out 70 comprises opposed vertical walls 72 and 74 meeting respective beveled surfaces 76, 78 extending to a planar bottom wall 80. The vertical walls 72, 74 and beveled surfaces 76, 78 are themselves not as wide as the thickness of the protective housing surrounding sidewall 52 from the outer and inner surfaces 62, 68. Instead, they are centered at the thickness of the sidewall 52 and extend to opposed outwardly beveled surfaces (not numerically designated) to provide the cut-out 70 with a smooth, aesthetic structure that will not chafe or cut the leads 40, 42 when they are supported therein.

Figure 7:
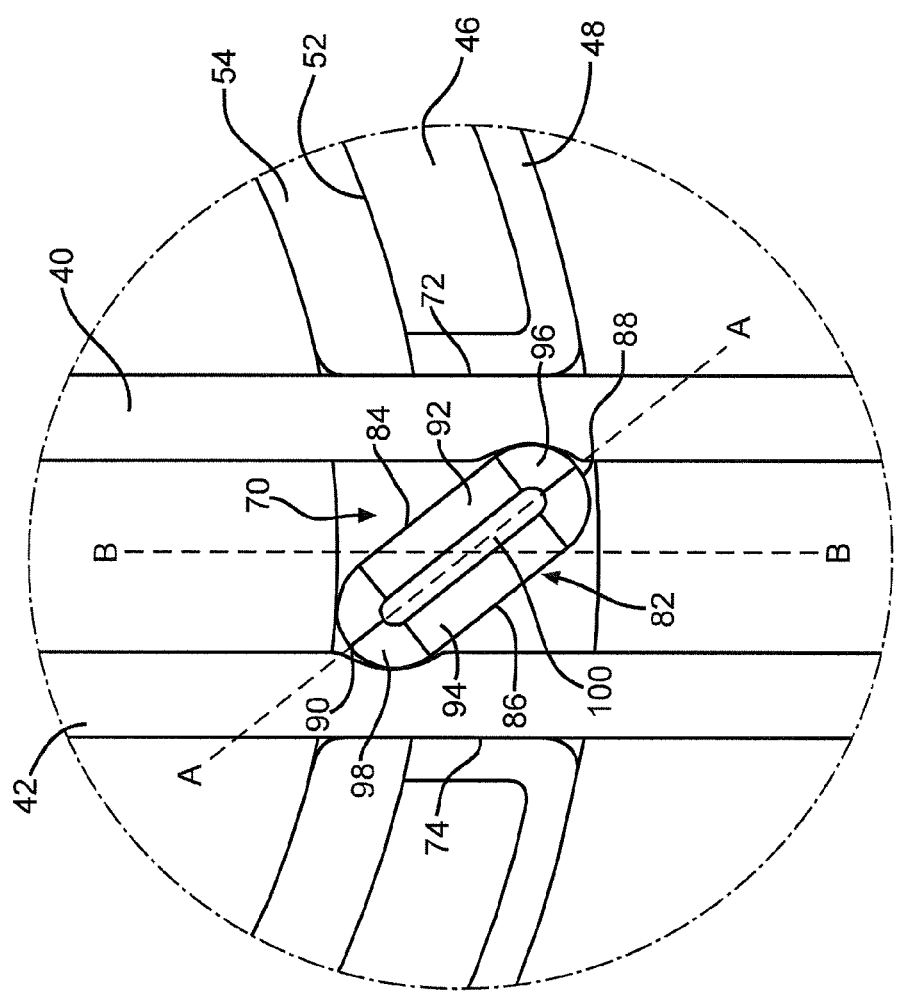
FIG. 7 is an enlarged view of the indicated area in FIG. 6.

An angled retaining wall 82 extends upwardly from the bottom wall 80. The retaining wall 82 may be spaced equidistant from the opposed vertical walls 72, 74 of the cut-out 70, or it may be closer to one vertical wall than the other. The retaining wall 82 is generally oval-shaped in cross-section. With respect to the orientation shown in FIG. 7, the retaining wall 82 comprises a right side 84 and a left side 86, each extending to opposed curved ends 88, 90. The right side 84, left side 86 and curved ends 88, 90 extend to respective upwardly and inwardly beveled portions 92, 94, 96 and 98 that, in turn, meet an oval-shaped upper surface 100. That way, the retaining wall 82 has a longitudinal axis A-A which is aligned at an acute angle with respect to an imaginary line B-B bisecting the distance between the opposed vertical walls 72, 74 of the recess cut-out 70. As will be described in detail hereinafter, this provides a pair of gaps 102 and 104 (FIGS. 2 and 3) between the retaining wall 82 and the cut-out 70. In particular, gap 102 is formed between the curved surface of the end 88 of the retaining wall 82 and the vertical wall 72 while gap 104 is formed between the curved surface of end 90 and the vertical wall 74 of the cut-out 70. These gaps 102, 104 are sized to receive in a tight-fitting relationship the respective lead wires 40 and 42 extending from the circuit board 26.

As shown in FIG. 5, the outer annular surface 62 of the protective housing 50 is substantially equal to the size of the cell header 14. A cylindrically shaped piece of shrink-wrap polymeric material 106 is positioned over the casing sidewall to extend upwardly beyond the upper end 56 of the protective housing 50. The polymeric material 106 is then heated, such as by a hot-air gun. This causes the polymeric material 106 to become semi-liquid and shrink down onto the cell and protective housing 50, lying over the upper end 56 thereof. In this position, the deformed shrink wrap 106 locks the protective housing 50 down onto the cell header 14.

Finally, a hot-melt polymeric material 108 is filled into the interior of the protective housing 50 to "pot" the circuit board 26 and its electrical components including the leads 40, 42 in place. The protective housing 50 is closed by a plate 110 seated on the inner annular edge 66 at the step 64.

Prior to the present invention, it was often very difficult to position the quick disconnect 48 at the distal end of the leads 40, 42 at a precise, distance from the protective housing sidewall 52. However, with the present protective housing 50, the leads 40, 42 are moved into a press-fit relationship with the respective gaps 102, 104, which are just a little less wide than the diameter of the leads. This serves to capture the leads therein at a precise distance from the quick disconnect 48. This distance is often critical for the end user of the electrochemical cell 10.

Furthermore, the angled relationship of the longitudinal axis A-A of the retaining wall 82 with respect to the imaginary line B-B bisecting the distance between the opposed vertical walls 72, 74 of the recess cut-out 70 is for the purpose of pinching a lead in one localized area and to allow for ease of adjustment of the lead into and out of the gaps 102, 104. That is in comparison to a design having the longitudinal axis of the retaining wall aligned perpendicular or normal to the imaginary line. Nonetheless, it is within the scope of the present invention to have the retaining wall 82 aligned normal to the imaginary line B-B.

In use, the cell is nested in a receiving cavity or receptacle with the leads 40, 42 extending from the protective housing 50. The leads must have a sufficient length to enable the quick disconnect 48 to be connected to a power connect (not shown), however, they must not have too much length or they will take up valuable space in the device being powered by the cell 10. Prior to the provision of the retaining wall 82 in the cut-out 70 of the protective housing 50, the leads 40, 42 were free to move in the cut-out. With the present invention, the leads 40, 42 will not inadvertently move in the cut-out unless an operator purposely repositions them.

Figure 8:
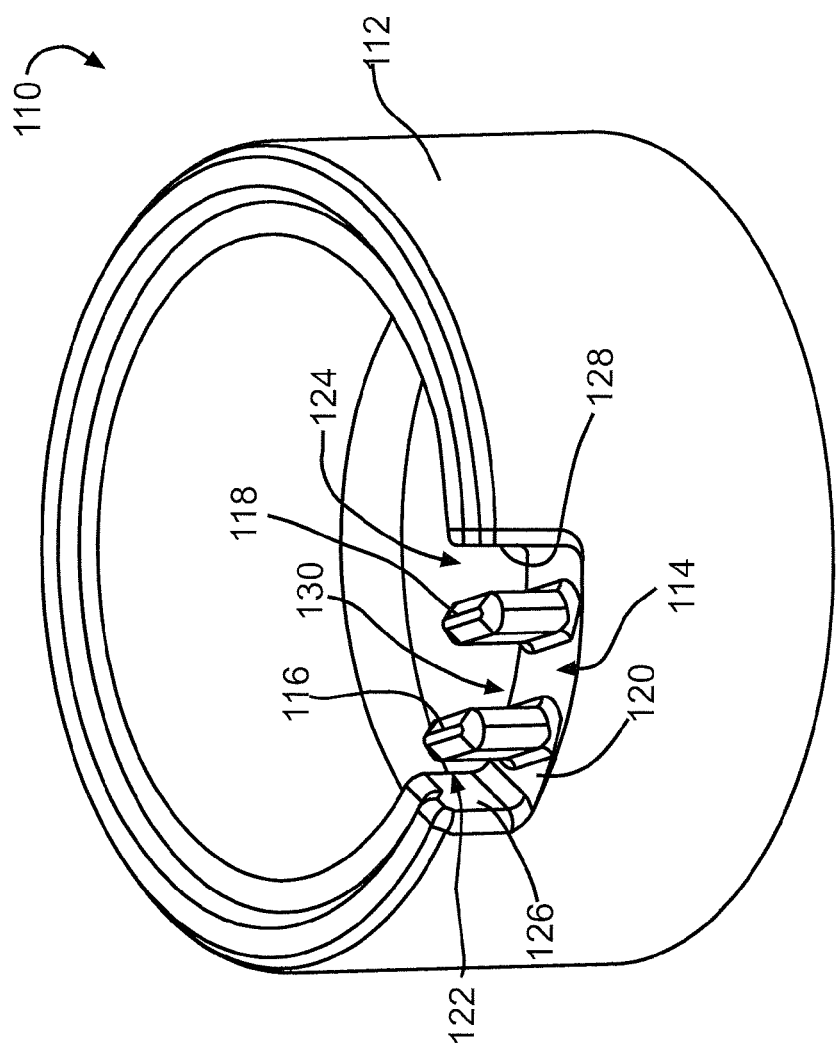
FIG. 8 is an alternate embodiment of a protective housing 110 according to the present invention.

FIG. 8 illustrates an alternate embodiment of a protective housing 110 according to the present invention. The protective housing 50 includes a surrounding sidewall 112 provided with a recess cut-out 114. As is the case with the previously described recess cut-out 70, the cut-out 114 has a smooth, aesthetic structure that will not chafe or cut the leads 40, 42 when they are supported therein. First and second angled retaining walls 116, 118 extend upwardly from a bottom wall 120 of the cut-out 114. The retaining walls 116, 118 are aligned in a similar direction or they may be aligned in opposite directions. In any event, the retaining walls 116, 118 provide two gaps 122 and 124 with the respective proximate vertical walls 126, 128 of the cut-out 114 and a third gap 130 between themselves. These gaps 122, 124 and 130 are sized to receive in a tight-fitting relationship lead wires (not shown in this drawing) extending from the circuit board 26 in a similar manner as the leads 40, 42 are captured in the gaps 102, 104 of the protective housing 50.

Those skilled in the art will readily understand that the use of two retaining walls 116, 118 is not to be viewed as limiting. Instead, it is exemplary of other embodiments having three, four and more retaining walls, limited only by the size of the protective housing and its surrounding sidewall and the diameter of the lead wire to be retained therein.

It is appreciated that various modifications to the inventive concepts described herein may be apparent to those skilled in the art without departing from the spirit and the scope of the present invention defined by the hereinafter appended claims.

What is claimed is:

1. An electrical energy storage device, comprising:
   a) a casing;
   b) an anode and a cathode with an intermediate separator preventing direct physical contact between them to form an electrode assembly housed inside the casing, wherein a terminal pin is electrically connected to one of the anode and the cathode and is of an opposite polarity than the casing electrically connected to the other of the anode and the cathode;
   c) a protective housing comprising a sidewall having a height extending from a lower end supported on the casing to an upper end;
   d) a circuit board electrically connected to the electrode assembly and surrounded by the sidewall of the protective housing;
   e) at least one lead having a length extending between a proximal end electrically connected to the circuit board and a spaced apart distal end;
   f) a cut-out extending from the upper end of the protective housing sidewall part way through its height toward the lower end thereof; and
   g) at least one retaining wall extending upwardly from a lower surface of the cut-out to thereby provide at least one gap between the retaining wall and the cut-out, the gap being of a width that is less than that of the lead so that the lead is movable into the gap to be captured therein with the distal lead end extending outwardly from the protective housing.

2. The electrical energy storage device of claim 1 wherein there are two leads extending from the circuit board and the retaining wall forms two gaps with the cut-out, each gap sized to receive on the leads in a tight-fitting relationship.

3. The electrical energy storage device of claim 1 wherein a quick-disconnect is provided on the distal end of the lead.

4. The electrical energy storage device of claim 1 wherein the casing has a cylindrical casing sidewall extending from a bottom wall to an open end closed by a header supporting the terminal pin in an insulated relationship with the casing.

5. The electrical energy storage device of claim 4 wherein the protective housing sidewall is of a substantially similar diameter as the cylindrical casing sidewall.

6. The electrical energy storage device of claim 4 wherein the circuit board is supported on the casing header.

7. The electrical energy storage device of claim 1 wherein the circuit board comprises a first lead electrically connected to the terminal pin and a second lead electrically connected to the opposite polarity casing.

8. The electrical energy storage device of claim 1 wherein a heat-shrunk sleeve of polymeric material secures the sidewall of the protective housing to the casing.

9. The electrical energy storage device of claim 1 further comprising a flowable polymeric material filled into the protective housing to pot the circuit board therein.

10. The electrical energy storage device of claim 1 wherein the retaining wall has a longitudinal axis that is at an acute angle with respect to an imaginary line bisecting the cut-out.

11. The electrical energy storage device of claim 1 wherein there are at least two retaining walls.

12. The electrical energy storage device of claim 11 wherein the two retaining walls have respective longitudinal axes that are angled in similar directions with respect to the imaginary line bisecting the cut-out.

13. The electrical energy storage device of claim 11 wherein the two retaining walls have respective longitudinal axes that are angled in dissimilar directions with respect to the imaginary line bisecting the cut-out.

14. A method for securing a protective housing for a circuit board to a casing of an electrochemical cell, comprising the steps of:
   a) providing the protective housing comprising a sidewall having a height extending from a lower end supported on the casing to an upper end, wherein a cut-out extends from the upper end of the protective housing sidewall part way through its height toward the lower end thereof;
   b) electrically connecting a circuit board to the electrode assembly and surrounded by the sidewall of the protective housing;
   c) providing at least one lead having a length extending between a proximal end electrically connected to the circuit board and a spaced apart distal end;
   d) providing a retaining wall extending upwardly from a lower surface of the cut-out to thereby provide a gap between the retaining wall and the cut-out, the gap being of a width that is less than that of the lead; and
   e) moving the lead into the gap so that it is captured therein with the distal lead end extending outwardly from the protective housing.

15. The method of claim 14 including providing two leads extending from the circuit board and the retaining wall forms two gaps with the cut-out, each gap sized to receive one the leads in a tight-fitting relationship.

16. The method of claim 14 including providing a quick-disconnect on the distal end of the lead.

17. The method of claim 14 including providing the casing having a cylindrical casing sidewall extending from a bottom wall to an open end closed by a header supporting the terminal pin in an insulated relationship with the casing.

18. The method of claim 17 including providing the protective housing sidewall of a substantially similar diameter as the cylindrical casing sidewall.

19. The method of claim 4 including supporting the circuit board on the casing header.

20. The method of claim 14 including providing the circuit board comprising a first lead electrically connected to the terminal pin and a second lead electrically connected to the opposite polarity casing.

21. The method of claim 14 including heat-shrinking a sleeve of polymeric material to the sidewall of the protective housing and to the casing.

22. The method of claim 14 including flowing a polymeric material into the protective housing to pot the circuit board therein.

23. The method of claim 14 including providing the retaining wall having a longitudinal axis that is at an acute angle with respect to an imaginary line bisecting the cut-out.

24. The method of claim 14 including providing the protective housing having at least two retaining walls.

25. The method of claim 24 including providing the two retaining walls having respective longitudinal axes angled in similar directions with respect to the imaginary line bisecting the cut-out.

26. The method of claim 24 including providing the two retaining walls having respective longitudinal axes angled in dissimilar directions with respect to the imaginary line bisecting the cut-out.

* * * * *